(12) United States Patent
Yamashita et al.

(10) Patent No.: US 11,355,302 B2
(45) Date of Patent: Jun. 7, 2022

(54) MULTI-BEAM BLANKING DEVICE AND MULTI-CHARGED-PARTICLE-BEAM WRITING APPARATUS

(71) Applicant: NuFlare Technology, Inc., Yokohama (JP)

(72) Inventors: Hiroshi Yamashita, Sagamihara (JP); Yoshikuni Goshima, Yokohama (JP); Hirofumi Morita, Setagaya-ku (JP); Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/169,782

(22) Filed: Feb. 8, 2021

(65) Prior Publication Data

US 2021/0296074 A1 Sep. 23, 2021

(30) Foreign Application Priority Data

Mar. 18, 2020 (JP) .............................. JP2020-047967

(51) Int. Cl.
*H01J 37/20* (2006.01)
*H01J 37/04* (2006.01)
*H01J 37/147* (2006.01)

(52) U.S. Cl.
CPC .......... *H01J 37/045* (2013.01); *H01J 37/147* (2013.01); *H01J 37/20* (2013.01); *H01J 2237/20228* (2013.01)

(58) Field of Classification Search
CPC ........ H01J 37/045; H01J 37/20; H01J 37/147; H01J 2237/20228

(Continued)

(56) References Cited

U.S. PATENT DOCUMENTS 8,987,677 B2 * 3/2015 Wieland .............. H01J 37/3177
250/396 R
2008/0203317 A1 * 8/2008 Platzgummer ...... H01J 37/3174
250/396 R (Continued)

FOREIGN PATENT DOCUMENTS

JP    2000-114147 A    4/2000
JP       3145149 B2    3/2001

(Continued)

OTHER PUBLICATIONS

Combined Taiwanese Office Action and Search Report dated Dec. 29, 2021 in Patent Application No. 110104187 (with English machine translation), 11 pages.

*Primary Examiner* — Michael Maskell
(74) *Attorney, Agent, or Firm* — Oblon, McClelland, Maier & Neustadt, L.L.P.

(57) ABSTRACT

In one embodiment, a multi-beam blanking device includes a semiconductor substrate, an insulating film that is disposed on the semiconductor substrate, an antistatic film that is disposed on the insulating film, a plurality of cells each of which is related to a through-hole that penetrate the semiconductor substrate and the insulating film and each of which includes a blanking electrode and a ground electrode that are disposed on the insulating film, and a ground wiring line that is disposed in the insulating film. The antistatic film and the ground wiring line are connected to each other at a joint that extends through the insulating film on the ground wiring line.

11 Claims, 5 Drawing Sheets

(58) Field of Classification Search
USPC .......................................... 250/492.1–492.3
See application file for complete search history.

(56) References Cited

U.S. PATENT DOCUMENTS

| | | | |
|---|---|---|---|
| 2010/0288938 A1* | 11/2010 | Platzgummer | H01J 37/3174 250/396 R |
| 2011/0266418 A1* | 11/2011 | Wieland | B82Y 40/00 250/208.2 |
| 2015/0021493 A1 | 1/2015 | Platzgummer | |
| 2016/0064178 A1 | 3/2016 | Matsumoto et al. | |
| 2016/0155600 A1 | 6/2016 | Chiba et al. | |
| 2017/0345612 A1 | 11/2017 | Touya et al. | |

FOREIGN PATENT DOCUMENTS

| | | |
|---|---|---|
| JP | 2001-109018 A | 4/2001 |
| JP | 2015-23286 A | 2/2015 |
| JP | 2016-54285 A | 4/2016 |
| JP | 2016-111046 A | 6/2016 |
| JP | 2017-216338 A | 12/2017 |

\* cited by examiner

MULTI-BEAM BLANKING DEVICE AND MULTI-CHARGED-PARTICLE-BEAM WRITING APPARATUS

CROSS REFERENCE TO RELATED APPLICATION

This application is based upon and claims benefit of priority from the Japanese Patent Application No. 2020-047967, filed on Mar. 18, 2020, the entire contents of which are incorporated herein by reference.

FIELD

The present invention relates to a multi-beam blanking device and a multi-charged-particle-beam writing apparatus.

BACKGROUND

As the densities of LSIs increase, the linewidths and wiring pitches of circuits of semiconductor devices become finer year by year. A circuit pattern of such a semiconductor device is formed in a manner in which a reduction projection exposure device is used to transfer a highly precise original pattern that is formed on a quartz substrate (a mask) to a wafer in a reduced scale by using a light such as an ArF laser as an illumination source (optical lithography). In recent years, EUV (extreme ultraviolet) lithography has started to be used to form finer patterns. In the EUV lithography, a mask that has a multilayer structure composed of multiple materials is used. With any mask, a highly precise original pattern is formed by using a so-called electron-beam lithography technique in which a resist on a mask blank (a sample) is selectively exposed to electron beam by using an electron-beam writing apparatus, and the pattern is formed.

A multi-beam writing apparatus that is known as an electron-beam writing apparatus utilizes a large number of beamlets at once by using, for example, multi-beams and has improved throughput. In the multi-beam writing apparatus, electron beams that are emitted from an electron gun, for example, pass through a shaping aperture array substrate that has multiple openings and form multi-beams (multiple electron beams). The multi-beams pass through related blankers of a blanking plate (a blanking aperture array substrate). The blanking plate includes a pair of electrodes (each blanker) for deflecting the beams individually and has openings through which the beams pass between the pair of electrodes. One of the electrodes (a ground electrode) of each blanker is fixed to a ground potential, and the other electrode (a blanking electrode) is switched between the ground potential and another potential for blanking deflection of the electron beams that pass therethrough. Electron beams that are deflected by the blankers are blocked by a limiting aperture that is placed between the blanking plate and the sample in the light path, and the sample is irradiated with electron beams that are not deflected.

The blanking plate includes a substrate that has multiple openings, the blankers that are formed around the openings, and a control circuit that applies a voltage to the blankers. A passivation (protection) film composed of insulating film such as silicon nitride film is typically formed on a substrate surface after a MOS transistor that is included in the control circuit is formed as in a typical semiconductor device. In the case where the insulating film is exposed from a surface of the blanking plate, the insulating film is charged when exposed to electron beam. As a result, electrostatic breakdown of, for example, a gate insulating film of the MOS transistor occurs, blanking control is lost, an electric field due to electrostatic charge changes the trajectory of the beams that pass through the openings, which causes displacement and defocusing of the beam on the sample, and there is a problem in that writing precision decreases.

For this reason, an antistatic film is formed on the protection film, and the protection film is prevented from being charged. The antistatic film is connected to a ground wiring line at an end portion of the blanking plate or the ground electrode. When ground connection failure of the antistatic film occurs for some reason, however, the antistatic film is locally charged due to, for example, scattered electrons and has a potential gradient. When a short circuit with the blanking electrode occurs, and a voltage is applied to the blanking electrode, the antistatic film has a local potential gradient. As a result of these phenomena, the electron beams are deflected in unintentional directions, and the writing precision is influenced, for example, the writing accuracy decreases.

DETAILED DESCRIPTION

In one embodiment, a multi-beam blanking device includes a semiconductor substrate, an insulating film that is disposed on the semiconductor substrate, an antistatic film that is disposed on the insulating film, a plurality of cells each of which is related to a through-hole that penetrate the semiconductor substrate and the insulating film and each of which includes a blanking electrode and a ground electrode that are disposed on the insulating film, and a ground wiring line that is disposed in the insulating film. The antistatic film and the ground wiring line are connected to each other at a joint that extends through the insulating film on the ground wiring line.

Hereinafter, an embodiment of the present invention will be described based on the drawings.

Figure 1:
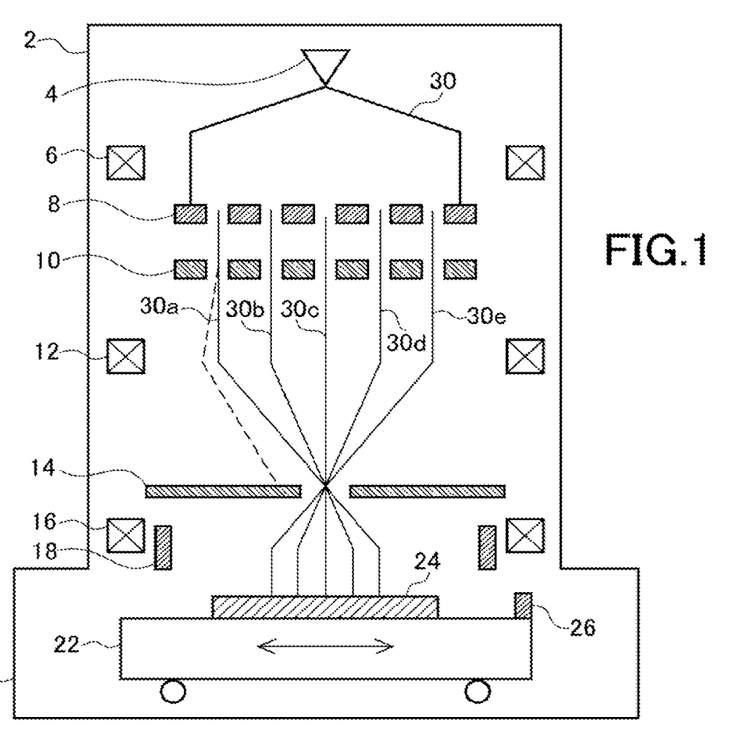
FIG. 1 schematically illustrates a multi-charged-particle-beam writing apparatus according to an embodiment of the present invention.

FIG. 1 schematically illustrates a multi-charged-particle-beam writing apparatus on which a blanking device according to the present embodiment is mounted. According to the present embodiment, a structure that uses an electron beam as an example of a charged particle beam will be described.

The charged particle beam, however, is not limited to the electron beam but may be another charged particle beam such as an ion beam.

A multi-electron-beam writing apparatus illustrated in FIG. 1 includes an electron column 2 and a writing chamber 20. In the electron column 2, an electron gun 4, an illumination lens 6, a shaping aperture array substrate 8, a blanking device 10, a reduction lens 12, a limiting aperture member 14, an objective lens 16, and a deflector 18 are disposed. An XY stage 22 is disposed in the writing chamber 20. A mask blank 24 that is a target substrate for writing is placed on the XY stage 22. Examples of an object include a wafer (for direct writing) and an exposure mask for transferring a pattern to a wafer by using a stepper or a scanner that includes an excimer laser or an extreme ultraviolet (EUV) exposure as a light source. Examples of the target substrate for writing include a mask on which a pattern has already been formed. A Levenson mask, for example, needs writing twice. For this reason, in some cases, an object is processed into a mask by writing once, and a pattern is written thereto for the second time. A mirror 26 for measuring the position of the XY stage 22 is disposed on the XY stage 22.

Figure 2:
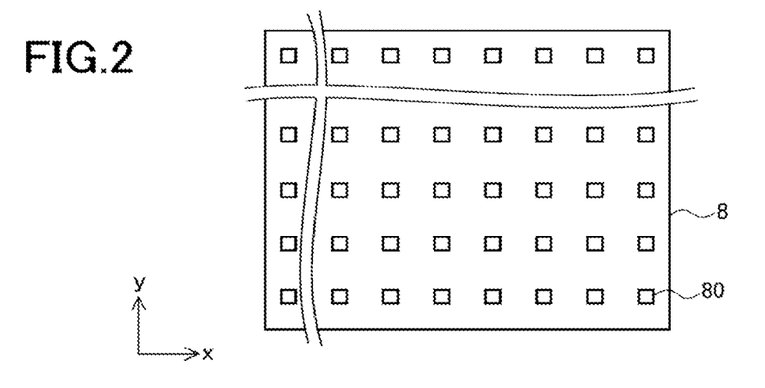
FIG. 2 schematically illustrates a shaping aperture array substrate.

An electron beams 30 that is emitted from the electron gun 4 illuminates the shaping aperture array substrate 8 in a substantially vertical direction with the illumination lens 6 used. FIG. 2 conceptually illustrates the structure of the shaping aperture array substrate 8. The shaping aperture array substrate 8 has openings 80 that are formed at a predetermined array pitch in a matrix of m columns (a y-direction) and n rows (a x-direction) (m and n 2). The openings 80 are formed so as to have rectangular shapes having the same dimensions. The openings 80 may have circular shapes having the same outer diameter.

The electron beam 30 illuminates a region that contains all of the openings 80 of the shaping aperture array substrate 8. The electron beam 30 passes through the openings 80, and multi-beams 30a to 30e are consequently formed as illustrated in FIG. 1.

Through-holes (one of which is a through-hole 110 in FIG. 4 and FIG. 5) are formed in the blanking device 10 so as to be related to the positions of the openings 80 of the shaping aperture array substrate 8 as described later. Blankers (one of which is a blanker 101 that includes a ground electrode 102 and a blanking electrode 104 in FIG. 5) each of which includes a pair of two electrodes are disposed in the respective through-holes. The multi-beams 30a to 30e that pass through the through-holes are separately deflected because of a voltage that is applied to the blankers. Beam blanking control is implemented by the deflection of the beams. The multi-beams that pass through the openings 80 of the shaping aperture array substrate 8 are blanking-deflected by the blanking device 10.

The beam size and array pitch of the multi-beams 30a to 30e that pass through the blanking device 10 are reduced by the reduction lens 12, and the multi-beams 30a to 30e travel toward a central opening that is formed in the limiting aperture member 14 in crossover arrangement. The trajectory of the beams that are deflected by the blankers of the blanking device 10 changes, and the beams shift from the central opening of the limiting aperture member 14 and are blocked by the limiting aperture member 14. The beams that are not deflected by the electrodes of the blanking device 10 pass through the central opening of the limiting aperture member 14.

The limiting aperture member 14 blocks the beams that are deflected by the blankers of the blanking device 10 such that the beams are in a beam-OFF state. Beams that pass through the limiting aperture member 14 during a period from beam-ON to beam-OFF correspond to beams for a single shot. The multi-beams 30a to 30e that pass through the limiting aperture member 14 are focused by the objective lens 16 and form a reduced image of the shaping aperture array substrate 8. The beams (the whole of the multi-beams) that pass through the limiting aperture member 14 are collectively deflected by the deflector 18 in the same direction, and the mask blank 24 is irradiated with the beams at the respective positions of emission.

The multi-beams that irradiate a mask blank 24 at once are ideally arranged at a pitch obtained by multiplying the array pitch of the openings 80 of the shaping aperture array substrate 8 by the desired reduction ratio described above. The writing apparatus performs writing operation in a raster scan method in which beams continuously and sequentially irradiate the mask blank 24. When a desired pattern is exposed, the beams are controlled depending on the pattern by implementing the blanking control such that the beams are in a beam-ON state. While the XY stage 22 continuously moves, the position of the beams on the mask blank 24 are controlled by the deflector 18 so as to follow the movement of the XY stage 22.

The components of the multi-electron-beam writing apparatus are controlled by a control device, not illustrated. The control device performs a multistage data conversion process on writing data and generates shot data peculiar to the apparatus. For the shot data, the exposure dose and the positions of each shot, for example, are defined. The control device obtains an exposure time t by dividing the exposure dose of each shot by a current density and applies a deflection voltage to the related blanker of the blanking device 10 such that the beam-ON state is created only for the exposure time t during the related shot.

The control device calculates the amount of deflection such that the beams are deflected to positions (coordinates) that the shot data represents and applies the deflection voltage to the deflector 18. Consequently, the multi-beams that are shot at this time are collectively deflected.

Figure 3:
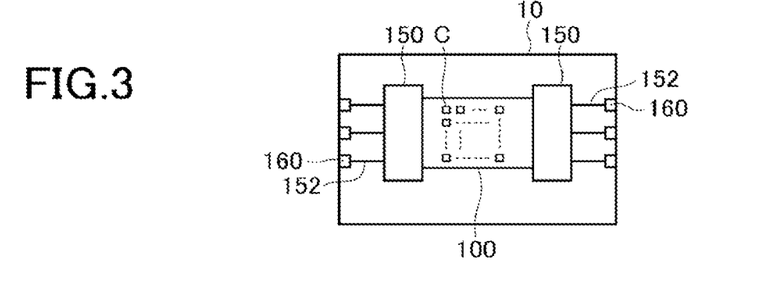
FIG. 3 conceptually illustrates the structure of a blanking device.

The structure of the blanking device 10 will now be described with reference to FIG. 3 to FIG. 5. As illustrated in FIG. 3, the blanking device 10 has a cell array region 100 and includes control circuits 150 that are disposed around the cell array region 100 and pad portions 160 that are disposed along edge portions. The control circuits 150 are not limited to control circuits that are disposed along the edge portions of the cell array region 100 but may be disposed at any positions, provided that there is no problem with the manufacture of the blanking device 10.

The control circuits 150 receive blanking control signals from an external control device via wiring lines 152, the pad portions 160, and external wiring lines, not illustrated. The wiring lines 152 are formed when a MOS transistor is formed and are disposed below a passivation film. When the blanking control signals are received, the control circuits 150 apply a voltage to the blanking electrodes 104 (see FIG. 5) via a blanking-control-signal wiring line 142 for blanking deflection. The control circuits 150 include circuits that use, for example, MOS transistors and CMOS inverters that are disposed as drivers at the final stage.

The pad portions 160 include ground electrode pads. The ground electrodes 102 are connected to the ground electrode pads with a ground wiring line 140 (see FIG. 5) and the wiring lines 152 interposed therebetween.

Figure 4:
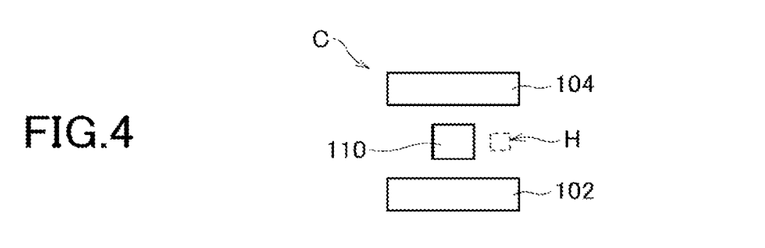
FIG. 4 schematically illustrates a cell.

As illustrated in FIG. 4, a set of cells C, each of which has the through-hole 110 and includes a pair of the ground electrode 102 and the blanking electrode 104 that face each other with the through-hole 110 interposed therebetween, are formed in the cell array region 100. The set of cells C are arranged in a matrix such that the through-holes 110 are related to the positions of the openings 80 of the shaping aperture array substrate 8.

Figure 5:
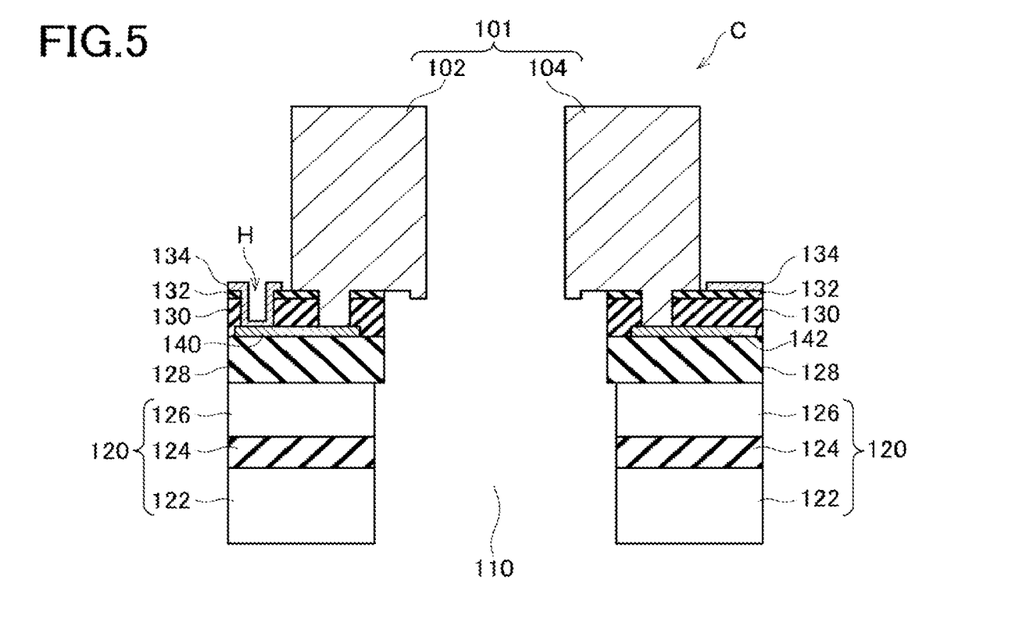
FIG. 5 illustrates a sectional view of the cell.

FIG. 5 illustrates a sectional view of the cell array region 100 of the blanking device 10. As illustrated in FIG. 5, the blanking device 10 includes a substrate 120, an insulating film 128 that is disposed (formed) on the substrate 120, the ground wiring line 140 and the blanking-control-signal wiring line 142 that are disposed on the insulating film 128, an insulating film 130 that is disposed (formed) on the ground wiring line 140 and the blanking-control-signal wiring line 142, a protection film (a passivation film) 132 that is disposed (formed) on the insulating film 130, an antistatic film 134 that is disposed (formed) on the protection film 132, the ground electrodes 102, and the blanking electrodes 104.

The substrate 120 may be, for example, a SOI (Silicon On Insulator) substrate obtained by inserting a silicon oxide film 124 between a silicon layer 122 and a silicon layer 126.

The insulating films 128 and 130 are, for example, silicon oxide films. The protection film 132 is, for example, a silicon nitride film. The ground wiring line 140 and the blanking-control-signal wiring line 142 are composed of, for example, aluminum, copper, or cobalt. The antistatic film 134 can be composed of a known material such as a material containing a metal film or a conductive polymer.

In the cell array region 100, the ground electrodes 102 and the blanking electrodes 104 are adjacent to the through-holes 110 that penetrate (extend through) the protection film 132, the insulating film 130, the insulating film 128, and the substrate 120 and face each other on the protection film 132.

The ground electrodes 102 extend through the protection film 132 and the insulating film 130 and are connected to the ground wiring line 140 in a lower layer. The blanking electrodes 104 extend through the protection film 132 and the insulating film 130 and are connected to the blanking-control-signal wiring line 142 in a lower layer.

CMOS transistors that are included in the control circuits 150, for example, are formed in the silicon layer 126 outside the cell array region 100.

Each cell C has an opening H (a hole) that extends through the protection film 132 and the insulating film 130, and the ground wiring line 140 in the lower layer is exposed to the opening H. The antistatic film 134 is also disposed (formed) on a side surface (a side wall) around the opening H and a surface of the ground wiring line 140 and is connected to the ground wiring line 140 via the opening H. That is, the antistatic film 134 that is disposed (formed) on the side surface around the opening H serves as a joint that extends through the protection film 132 and the insulating film 130 on the ground wiring line 140 and that connects the antistatic film 134 on the protection film 132 and the ground wiring line 140 in the lower layer to each other.

Each cell C has the single opening H or multiple openings H. That is, each cell C includes the joint between the antistatic film 134 and the ground wiring line 140. This prevents ground connection failure of the antistatic film 134 from occurring, prevents the antistatic film 134 from having a local potential gradient, and improves the writing accuracy.

When the blanking device 10 is manufactured, the transistors that are included in the control circuits 150, for example, are formed on the substrate 120 by using a known CMOS process, and the insulating film 128 is formed on the substrate 120. The insulating film 128 is a so-called inter-layer insulating film, and multiple layers may be formed. Subsequently, a wiring line layer is formed on the insulating film 128, a pattern process is performed, and the ground wiring line 140 and the blanking-control-signal wiring line 142 are formed. Barrier metal may be formed on a surface of the ground wiring line 140.

Subsequently, the insulating film 130 is formed so as to cover the ground wiring line 140 and the blanking-control-signal wiring line 142. Subsequently, the protection film 132 is formed on the insulating film 130. Subsequently, the substrate 120 is etched, and the through-holes 110 are formed.

Subsequently, the openings H are formed so as to extend through the protection film 132 and the insulating film 130 such that the surface of the ground wiring line 140 is exposed thereto. For example, the single opening H or roughly two openings H are formed near each through-hole 110. Subsequently, the antistatic film 134 is formed on the protection film 132. At this time, the antistatic film 134 is formed also on the side surface of each opening H and the surface of the ground wiring line 140 that is exposed to the opening H. Consequently, each joint that connects the ground wiring line 140 and the antistatic film 134 on the protection film 132 to each other is formed. Subsequently, the antistatic film 134 is patterned, and the antistatic film 134 is removed from an electrode formation region. In this way, the blanking electrodes 104 that are manufactured later and the antistatic film 134 are not short-circuited.

Subsequently, openings are formed so as to extend through the protection film 132 and the insulating film 130 such that the surfaces of the ground wiring line 140 and the blanking-control-signal wiring line 142 are exposed thereto. Subsequently, Au electroplating, for example, is performed, and the ground electrodes 102 that are connected to the ground wiring line 140 and the blanking electrodes 104 that are connected to the blanking-control-signal wiring line 142 are formed (a seed layer that is needed for electroplating is not illustrated).

The blanking device 10 can thus be manufactured such that the joint between the antistatic film 134 and the ground wiring line 140 is disposed for every cell.

Figure 6:
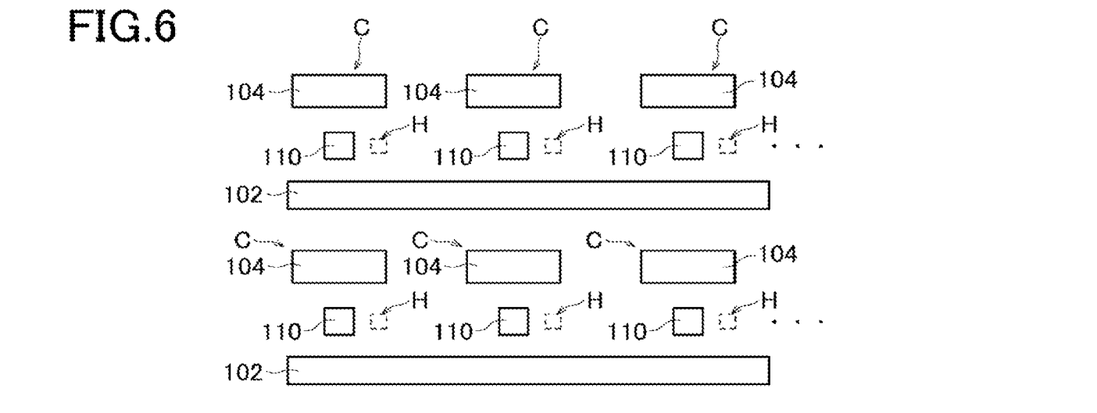
FIG. 6 schematically illustrates the structure of a cell array.

When the cells C are arranged in an array in the cell array region 100, as illustrated in FIG. 6, the ground electrodes 102 of the adjacent cells C may be connected with each other such that the ground electrodes 102 linearly extend in a predetermined direction (a left-and-right direction in the figure).

Figure 7A:
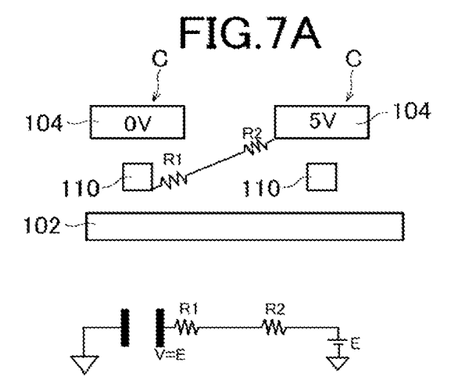
FIG. 7A illustrates an equivalent circuit diagram of a cell array in a comparative example.
Figure 7B:
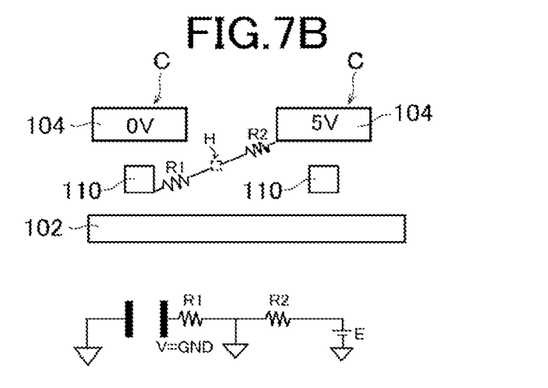
FIG. 7B illustrates an equivalent circuit diagram of the cell array according to the embodiment.

In the case where the joint between the antistatic film 134 and the ground wiring line 140 is not disposed for every cell C, as illustrated in FIG. 7A, there is a possibility that opening portions of the adjacent cells C and the side wall around each through-hole 110 have a potential E through the antistatic film 134, and that the electron beams are deflected in unintentional directions. However, in the case where the joint between the antistatic film 134 and the ground wiring line 140 is disposed for every cell C as in the present embodiment, as illustrated in FIG. 7B, the potential of the adjacent cells C can be prevented from changing.

Figure 8:
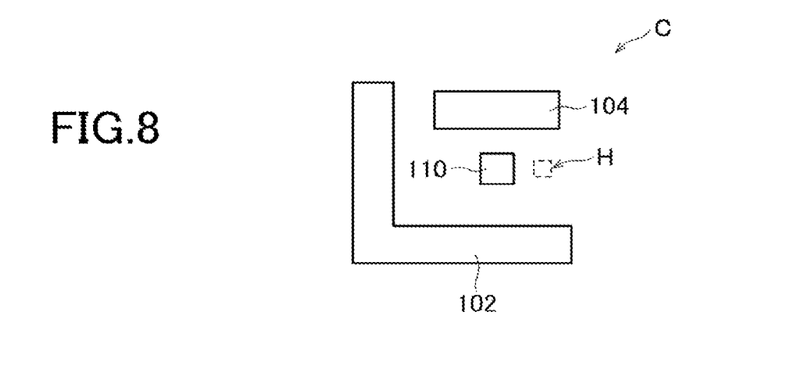
FIG. 8 schematically illustrates a cell.

The ground electrodes 102 are not limited to electrodes that extend in a single direction but may extend in a first direction and a second direction perpendicular to the first direction. For example, the shape of each ground electrode 102 in a plan view may be an L-shape as illustrated in FIG. 8.

Figure 9:
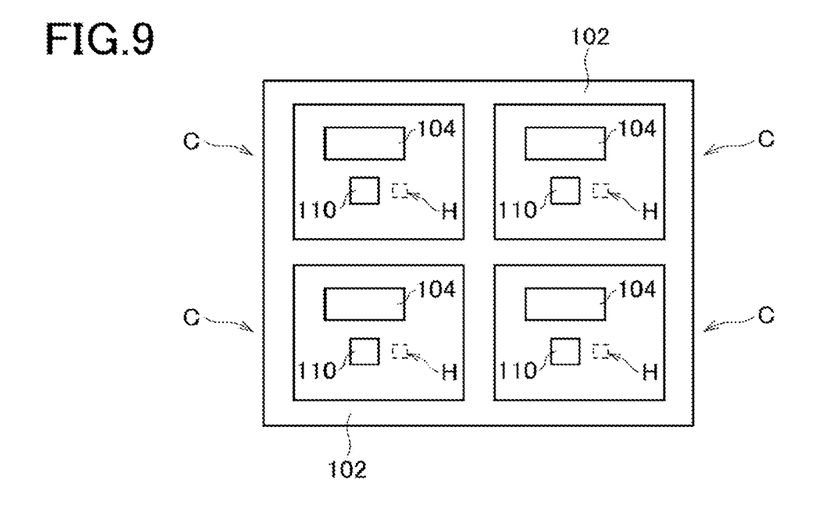
FIG. 9 schematically illustrates the structure of a cell array.

When the cells C are arranged in an array in the cell array region 100, the L-shaped ground electrodes 102 of the adjacent cells C may be coupled with each other, and as illustrated in FIG. 9, the ground electrodes 102 may have a lattice shape. The blanking electrodes 104, the through-holes 110, and the openings H are located in respective regions that are surrounded by the ground electrodes 102, and each cell C is formed.

Figure 10A:
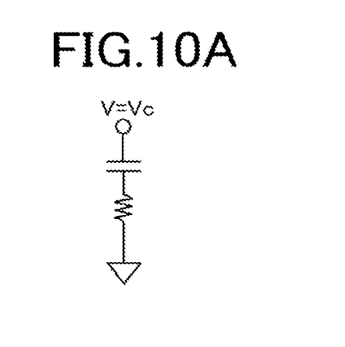
FIG. 10A illustrates an equivalent circuit diagram of an antistatic film in a comparative example.
Figure 10B:
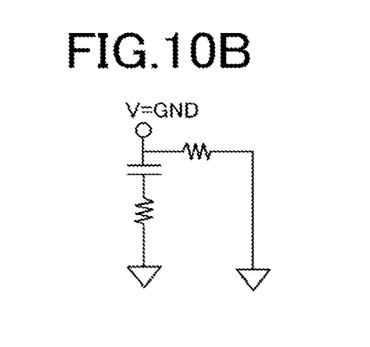
FIG. 10B illustrates an equivalent circuit diagram of an antistatic film according to the embodiment.

If connection failure between the antistatic film 134 and the ground electrodes 102 occurs, the antistatic film 134 is charged due to, for example, scattered electrons even when surrounded by the ground electrodes 102, and as illustrated in FIG. 10A, the antistatic film 134 has a potential Vc. There is a possibility that an electric field that is produced due to this electrostatic charge causes the electron beams of the adjacent cells are deflected in unintentional directions. However, in the case where the joint between the antistatic film 134 and the ground wiring line 140 is disposed for every cell C as in the present embodiment, as illustrated in FIG. 10B, the antistatic film 134 can have the ground potential for every cell with certainty.

Figure 11:
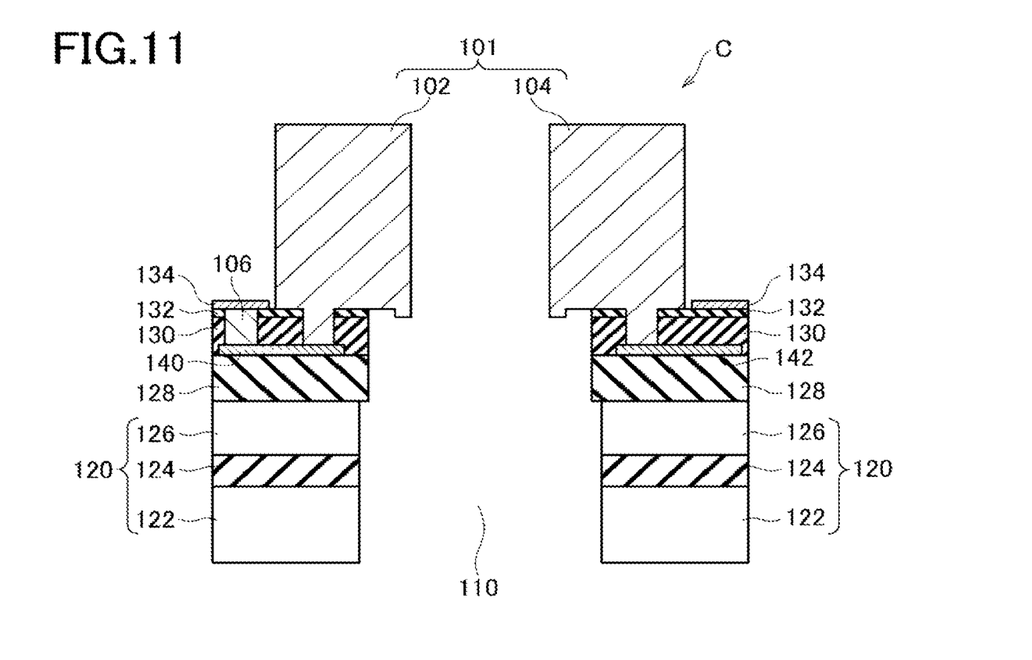
FIG. 11 illustrates a sectional view of a cell.

According to the embodiment described above, each joint between the antistatic film 134 and the ground wiring line 140 directly connects the antistatic film 134 and the ground wiring line 140 in the lower layer to each other in a manner in which the antistatic film 134 is formed also on the side wall around each opening H. However, as illustrated in FIG. 11, each opening H may be filled with a metal plug 106 composed of, for example, tungsten, and the antistatic film 134 may be formed on the protection film 132 and the metal plug 106. The antistatic film 134 is electrically connected to the ground wiring line 140 with the metal plug 106 that serves as the joint interposed therebetween. The joint may be obtained by filling the opening H with a conductor, and examples of the conductor can include Cu (copper), Al (aluminum), and polysilicon.

The antistatic film 134 and the ground wiring line 140 are not necessarily connected to each other by using only the joint. In the case where the antistatic film 134 is disposed (formed) on a ground wiring line that is formed on an insulating film or the ground electrodes 102, the antistatic film 134 and the ground wiring line 140 are connected to each other at the joint with the ground electrodes 102, for example, interposed therebetween.

The number of the joints that are formed in the openings H is preferably one or more in each cell but is not necessarily one or more in each cell. There may be a cell that includes no joint, provided that local electrification and the potential gradient can be sufficiently inhibited to such an extent that the writing accuracy is not affected. Each cell may include multiple joints.

The antistatic film 134 may be a high-resistance film that has a resistance higher than those of the ground electrodes 102 and the blanking electrodes 104 and lower than those of the protection film 132 and the insulating film 130, and the high-resistance film may be formed on the entire blanking device 10 after the ground electrodes 102 and the blanking electrodes 104 are formed.

The high-resistance film has a resistance value that is adjusted to such an extent that the electrodes are not short-circuited, electrons escape to the ground wiring line 140 via the high-resistance film, and negative charges are not accumulated. The high-resistance film may be connected to the blanking electrodes 104.

Examples of the high-resistance film can include metal thin films such as Au (gold), Ag (silver), Cu (copper), Fe (iron), Cr (chromium), CrN (chromium nitride), Ti (titanium), TiN (titanium nitride), TaN (tantalum nitride), TiC (titanium carbide), and Pt (platinum) films. As for metal films that have film thicknesses of about several ten nanometers, the electrical resistance values thereof sharply increase as the film thicknesses decrease. The high-resistance film is a metallic thin film the film thickness of which is several ten nanometers, preferably several nanometers.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-beam blanking device, comprising:
    a semiconductor substrate;
    an insulating film that is disposed on the semiconductor substrate;
    an antistatic film that is disposed on the insulating film;
    a plurality of cells each of which is related to a through-hole that penetrates the semiconductor substrate and the insulating film and each of which includes a blanking electrode and a ground electrode that are disposed on the insulating film; and
    a ground wiring line that is disposed in the insulating film,
    wherein the antistatic film and the ground wiring line are connected to each other at a joint that extends through the insulating film on the ground wiring line, and
    wherein the joint is provided at a position different from the ground electrode.

2. The blanking device according to claim 1, wherein the joint is disposed for each cell.

3. The blanking device according to claim 2, wherein a plurality of the joints are disposed for each cell.

4. The blanking device according to claim 1, wherein the joint includes the antistatic film that is formed in an opening portion that is formed in the insulating film.

5. The blanking device according to claim 4, wherein the joint includes the antistatic film that is disposed on a side wall of the opening portion and on a surface of the ground wiring line.

6. The blanking device according to claim 1, wherein the antistatic film and the ground wiring line are connected to each other at the joint by a conductor embedded in the insulating film.

7. The blanking device according to claim 1, wherein the ground electrodes of adjacent cells are connected with each other such that the ground electrodes linearly extend.

8. The blanking device according to claim 1, wherein the ground electrode has an L-shape in a plan view.

9. The blanking device according to claim 1, wherein the ground electrodes of adjacent cells are connected with each other such that the ground electrodes have a lattice shape, and the blanking electrode, the through-hole, and the joint of one of the cells are located in a region that is surrounded by the ground electrodes.

10. A multi-beam blanking device, comprising:
    a semiconductor substrate;
    an insulating film that is disposed on the semiconductor substrate;
    an antistatic film that is disposed on the insulating film;
    a plurality of cells each of which is related to a through-hole that penetrates the semiconductor substrate and the insulating film and each of which includes a blanking electrode and a ground electrode that are disposed on the insulating film; and a ground wiring line that is disposed in the insulating film, wherein the antistatic film and the ground wiring line are connected to each other at a joint that extends through the insulating film on the ground wiring line, and wherein the antistatic film has a resistance higher than those of the blanking electrode and the ground electrode and lower than that of the insulating film.

11. A multi-charged-particle-beam writing apparatus, comprising:

a movable stage on which an object to be irradiated with a multi charged particle beams is placed;

the blanking device according to claim 1 that individually controls beam ON-OFF for each beam of the multi charged particle beams; and a deflector that deflects the each beam together to irradiate respective irradiation positions of the object with the each beam that pass through the blanking device.

* * * * *